United States Patent

Kasano et al.

[15] 3,694,759

[45] Sept. 26, 1972

[54] SOLID STATE ELECTRONIC DEVICE USING QUATERNARY COMPOUND SEMICONDUCTOR MATERIAL CONSISTING OF GALLIUM, INDIUM, PHOSPHOR AND ARSENIC

[72] Inventors: Hiroyuki Kasano, Akishima; Kazuhiro Kurata, Hachioji; Masahiko Ogirima, Tokyo; Masao Kawamura, Kokubunji; Hazime Kusumoto, Tokyo, all of Japan

[73] Assignee: Hitachi, Ltd., Tokyo, Japan

[22] Filed: July 21, 1970

[21] Appl. No.: 56,875

[30] Foreign Application Priority Data

July 23, 1969 Japan ......................44/57701

[52] U.S. Cl. ....................330/4.9, 330/40, 313/108 D

[51] Int. Cl. ..................................................H03f 7/00

[58] Field of Search ......................330/4.9; 313/108 D

[56] References Cited

UNITED STATES PATENTS

| | | |
|---|---|---|
| 3,265,990 | 8/1966 | Burns et al................331/94.5 |
| 3,493,811 | 2/1970 | Ewing................313/108 D X |
| 3,508,126 | 4/1970 | Newman et al....313/108 D X |

*Primary Examiner*—Nathan Kaufman

*Attorney*—Craig & Antonelli

[57] ABSTRACT

A single crystal of quaternary compound semiconductor material consisting of gallium, indium, phosphor and arsenic has excellent properties including a large band gap, high mobility, high thermal conductivity and satisfactory crystallinity. A solid state electronic device having a microwave element or light-emitting element made from this single crystal exhibits excellent performance.

30 Claims, 14 Drawing Figures

INVENTORS
HIROYUKI KASANO, KAZUHIRO KURATA,
MASAHIKO OGIRIMA, MASAO KAWAMURA,
& HAZIME KUSUMOTO

BY Craig, Antonelli, Stewart & Hill
ATTORNEYS

INVENTORS
HIROYUKI KASANO, KAZUHIRO KURATA,
MASAHIKO OGIRIMA, MASAO KAWAMURA,
& HAZIME KUSUMOTO

BY Craig, Antonelli, Stewart & Hill
ATTORNEYS

INVENTORS
HIROYUKI KASANO, KAZUHIRO KURATA,
MASAHIKO OGIRIMA, MASAO KAWAMURA,
& HAZIME KUSUMOTO

BY Craig, Antonelli, Stewart & Hill
ATTORNEYS

SOLID STATE ELECTRONIC DEVICE USING QUATERNARY COMPOUND SEMICONDUCTOR MATERIAL CONSISTING OF GALLIUM, INDIUM, PHOSPHOR AND ARSENIC

This invention relates to solid state electronic devices using group III–V compound semiconductor materials, and more particularly to a solid state electronic device using a mixed crystal of InP, InAs, GaP and GaAs.

It is commonly known that the crystals of group III–V compound semiconductors are superior with respect to the band gap, carrier mobility and other properties as compared to the crystals of germanium and silicon. Because of these excellent properties, a device using such a group III—V compound semiconductor crystal exhibits excellent performance which cannot be obtained with devices using germanium and silicon.

GaAs, for example, has a high electron mobility of the order of 8,000 to 11,000 $cm^2/V$ sec and a relatively large band gap of 1.36 eV at room temperature. Further, it has a band structure of the direct transition type. Furthermore, there are two kinds of band minima in the conduction band of GaAs. By virtue of the excellent properties and the type of band structure described above, GaAs is utilized as a material for high-speed switching elements, field effect transistors, high-power electronic elements, solid state oscillation elements and infrared laser diodes.

GaP has a low electron mobility of the order of 100 to 200 $cm^2/V$ sec at room temperature and a band structure of the indirect transition type, but it is advantageous in that it has a large band gap of 2.25 eV and a pn junction can be easily formed therein. Making use of the above advantages, GaP is utilized as a material for light-emitting diodes which emit visible light.

A mixed crystal consisting of a mixture of binary compound semiconductor crystals as described above has quite novel properties in which the respective properties of the component crystals are complemented with respect to each other. The novel properties are utilized in novel applications. For instance, a mixed crystal having the composition of $GaP_{0.4}\,As_{0.6}$ among ternary mixed crystals which consist of GaAs and GaP and are represented by the formula $Ga\,P_x\,As_{1-x}$ ($0<x<1$), has a band structure of the direct transition type and a large band gap of 1.85 eV. Thus, a light-emitting diode made from this mixed crystal radiates visible light and yet exhibits an emission efficiency which is higher than that of a light-emitting diode made from GaP having a band structure of the indirect transition type. Further, the former radiates visible laser beams when it is combined with a resonator structure.

As will be seen from the above description, a mixed crystal shows novel properties which are not present in the component crystals and thus provides a novel device. The mixed crystals utilized heretofore have been ternary mixed crystals including three elements, and therefore, the properties newly produced by the mixing of these elementary crystals have been quite limited.

It is therefore an object of the present invention to provide a solid state light or of micro wave-emitting device of high efficiency and high output using a quaternary mixed crystal consisting of gallium, indium, phosphor and arsenic.

A further object of the present invention is to provide a circuit element using a mixed crystal of the kind described above so that it is operable with a high frequency limit and is capable of high-speed operation.

In the Ga – In – P – As system a solid solution can be formed over the whole composition range. That is, a mixed crystal having the composition of $Ga_x\,In_{1-x}\,P_y\,As_{1-y}$ is formed over the whole range of $0<x<1$ and $0<y<1$. The mixed crystal shows various properties depending upon various combinations of the values of $x$ and $y$, and a device utilizing such a mixed crystal exhibits excellent performance.

Other objects, features and advantages of the present invention will be apparent from the following detailed description of some embodiments thereof taken in conjunction with the accompanying drawings, in which:

FIG. 1*a* is a longitudinal sectional view of a three-stage reactor tube employed for growing a mixed crystal in the form of $Ga_x\,In_{1-x}\,P_y\,As_{1-y}$ used in the present invention by the method of vapor phase epitaxy;

FIG. 1*b* is a graph showing the distribution of temperatures maintained within the tube during the epitaxial growth of the mixed crystal;

FIGS. 2*a* through 2*g* are schematic sectional views showing successively the steps of growth of the mixed crystal and the steps for the manufacture of a light-emitting diode using the mixed crystal;

At first, a first embodiment of the present invention will be described which includes a light-emitting diode made of a mixed crystal having the composition of $Ga_{0.81}\,In_{0.19}\,P_{0.88}\,As_{0.12}$.

Figures 1A, 1B:
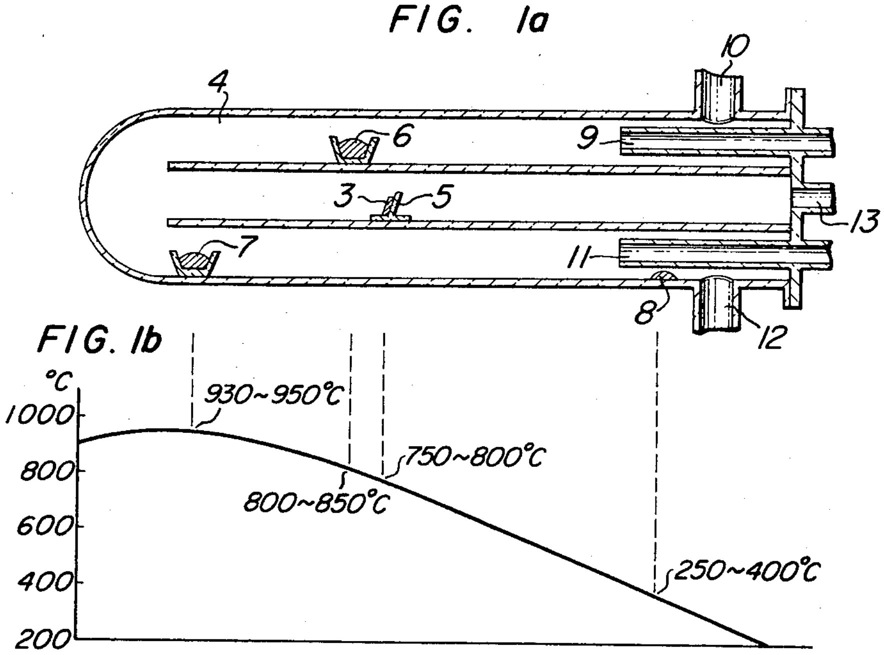

FIGS. 1*a* and 1*b* are a longitudinal sectional view of a three-stage quartz reactor tube employed for the epitaxial growth of the mixed crystal of the above composition and a graph showing the temperature distribution within the reactor tube, respectively. FIGS. 2*a* through 2*g* show successively the steps of the epitaxial growth of the mixed crystal on a substrate and the steps of manufacturing a light-emitting diode from the mixed crystal.

Figure 2A:
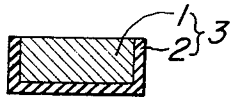

A single crystal wafer 1 of GaAs doped with tellurium of a concentration of $10^{18}$ $cm^{-3}$ is employed as a substrate, and the (100) plane of the single crystal is polished to a mirror finish for growing the mixed crystal on this plane. The back and side surfaces of the single crystal wafer 1 are coated with a silicon dioxide layer 2 about 5,000 A. thick as shown in FIG. 2*a*.

The substrate 3 consisting of the single crystal 1 and the silicon dioxide layer 2 is placed on a carrier 5 of quartz and is set at a predetermined position on the middle stage of a three-stage quartz reactor tube 4 in such a relation that the surface of the substrate 3 is inclined at about 60° with respect to the horizontal. Prior to the insertion of the substrate 3 into the reactor tube 4, it is etched by a 1 : 1 : 2 mixture of $H_2SO_4$, $H_2O_2$ and $H_2O$ and is then cleaned and dried.

A low-temperature source 6 of high-purity indium in an amount of about 7 grams is placed at a predetermined position on the upper stage of the reactor tube 4. Further, a high-temperature source 7 of gallium in an amount of about 8 grams and a dopant source 8 of high-purity tellurium in an amount of about 0.3 gram are placed at respective predetermined positions on the lower stage of the reactor tube 4.

The reactor tube 4 is placed in an electric furnace (not shown) having therein a desired temperature gradient. Streams of high-purity hydrogen in a total flow rate of about 600 cc/minute are introduced into the reactor tube 4 through gas inlets 9 and 10 disposed at the upper stage of the reactor tube 4 and through gas inlets 11 and 12 disposed at the lower stage of the reactor tube 4, and are discharged outside through a gas outlet 13 disposed at the middle stage of the reactor tube 4. The introduction of the gas is continued for about 3 hours to completely replace the air in the reactor tube 4 by hydrogen. Then, the introduction of hydrogen is stopped and current is supplied to the electric furnace for raising the temperature within the reactor tube 4. Simultaneously with the energization of the electric furnace, streams of high-purity hydrogen containing 0.9 mol percent $PH_3$ and 0.1 mol percent $AsH_3$ are introduced through the gas inlets 10 and 12 into the reactor tube 4 at respective flow rates of 20 cc/minute and 80 cc/minute. The current supplied to the electric furnace is suitably regulated until the temperatures of the substrate 3, low-temperature source 6, high-temperature source 7 and dopant source 8 attain the respective levels shown in FIG. 1*b*, and this condition is maintained for about 30 minutes. Streams of hydrogen containing 2 mol percent HCl are introduced through the gas inlets 9 and 11 into the reactor tube 4 at respective flow rates of 15 cc/minute and 35 cc/minute. In about 4 hours after the gas introduction is started, the introduction of gas from the four gas inlets is stopped, and the temperature of the reactor tube 4 is lowered to room temperature. Subsequently, the substrate 3 is taken out of the reactor tube 4.

Figure 2B:
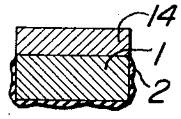
Figure 2C:
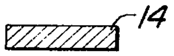

By the above process, a single crystal layer 14 about 210 $\mu$ thick grows on the single crystal wafer 1 of GaAs as shown in FIG. 2*b*. During the above process, the silicon dioxide layer 2 covering the GaAs crystal 1 is etched by the halogen vapor in a manner as shown. The substrate portion 3 is removed from the specimen by grinding, and silicon dioxide is completely removed by treatment with hydrofluoric acid so as to obtain solely the grown layer 14 as shown in FIG. 2*c*. Analysis on the mirror polished surface of the grown layer 14 by means of an X-ray microanalyzer showed that the grown layer has the composition of $Ga_x\ In_{1-x}\ P_y\ As_{1-y}$ where $x =$ 0.81 and $y =$ 0.88, that is, the composition of $Ga_{0.81}\ In_{0.19}\ P_{0.88}\ As_{0.12}$.

Figure 2D:
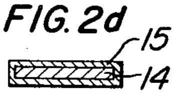
Figure 2E:
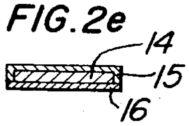
Figure 2F:
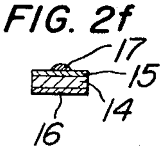
Figure 2G:
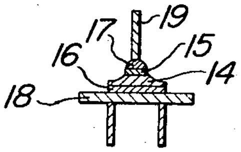

The grown layer 14 is then ground to a thickness of about 150 $\mu$. Subsequently, the grown layer 14 is enclosed under vacuum in a quartz ampule together with 0.8 milligram of phosphor, 1.6 milligrams of arsenic and 3.4 milligrams of zinc, and zinc diffusion treatment is carried out while maintaining the ampule at about 800° to 900° C. By this treatment, a p-type layer 15 is formed on the entire surfaces of the grown layer 14 as shown in FIG. 2*d*. One of the surfaces of the crystal piece is ground to remove the p-type layer thereon, and a plated nickel layer 16 is deposited on the ground surface as shown in FIG. 2*e*. A pellet of about 1 mm × 1 mm is cut out from the specimen and a dot of gold is joined to the surface of the p-type layer as shown in FIG. 2*f*. The pellet is then subjected to mesa etching and mounted on a diode package 18, and an indium-gold alloy wire 19 is welded to the dot 17 as shown in FIG. 2*g*. A pn diode using the mixed crystal of composition $Ga_{0.81}\ In_{0.19}\ P_{0.88}\ As_{0.12}$ is obtained by the above steps. A D.C. bias supply is connected to the diode as shown in a block diagram of FIG. 3. When forward current of a 5 mA was supplied to the diode, emission having a peak at 5,900 A. was produced at the junction layer. The half width of this peak was about 350 A.

In a second embodiment of the present invention to be described hereunder, a mixed crystal having the composition of $Ga_{0.88}\ In_{0.12}\ P_{0.88}\ As_{0.12}$ is epitaxially grown and a light-emitting diode is made from this mixed crystal.

Figure 3:
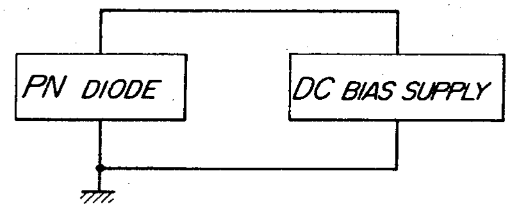
FIG. 3 is a block diagram showing the electrical connection of a light-emitting device according to the present invention.

In the first embodiment, streams of hydrogen containing 2 mol percent HCl have been introduced through the gas inlets 9 and 11 into the reactor tube 4 at respective flow rates of 15 cc/minute and 35 cc/minute during the epitaxial growth of the mixed crystal. However, in the second embodiment, the flow rates of the hydrogen streams are changed to 10 cc/minute and 45 cc/minute, respectively, while the other conditions remain the same as those in the first embodiment. In this case, an n-type mixed crystal grows which has the composition of $Ga_{0.88}\ In_{0.12}\ P_{0.88}\ As_{0.12}$, that is, $x = y = 0.88$ in the formula $Ga_x\ In_{1-x}\ P_y\ As_{1-y}$. Steps similar to those employed in the first embodiment are applied to this mixed crystal to obtain a pn junction diode, and a D.C. bias supply is connected to the diode as shown in FIG. 3. When forward current is supplied to the diode, it emitted green light having a large half-width peak at 5,650 A.

A third embodiment of the present invention to be described now includes a light-emitting diode made from an epitaxially grown mixed crystal having the composition of $Ga_{0.72}\ In_{0.28}\ P_{0.5}\ As_{0.5}$. During the epitaxial growth of the mixed crystal, a stream of hydrogen containing 2 mol percent HCl and flowing at a rate of 30 cc/minute, a stream of hydrogen containing 2 mol percent HCl and flowing at a rate of 25 cc/minute, a stream of hydrogen containing 0.66 mol percent $PH_3$ and 0.34 mol percent As $H_3$ and flowing at a rate of 50 cc/minute, and a stream of hydrogen containing 0.5 mol percent $PH_3$ and 0.5 mol percent $AsH_3$ and flowing at a rate of 50 cc/minute are introduced into the reactor tube 4 through the respective gas inlets 9, 11, 10 and 12, while the other conditions remain the same as those in the first embodiment. According to this embodiment, an n-type mixed crystal of single-crystalline structure grows and has the composition of $Ga_{0.72}\ In_{0.28}\ P_{0.5}\ As_{0.05}$. Measurement taken at 300° K. on a specimen made of this mixed crystal showed that it has a carrier concentration of $8 \times 10^{17}\ cm^{-3}$ and a Hall mobility of 8,500 to 9,000 $cm^2/V$ sec.

Zinc is diffused into the mixed crystal in a manner similar to that employed in the first embodiment to make a pn diode, and a D.C. bias supply is connected to the pn diode as shown in FIG. 3. When forward current was supplied to the diode, it emitted light of high efficiency having a sharp peak at 8,200 A.

In a fourth embodiment of the present invention to be described hereunder, a mixed crystal having the composition of $Ga_{0.81}\ In_{0.19}\ P_{0.11}\ As_{0.89}$ is grown and a light-emitting diode is made from this mixed crystal.

According to this embodiment, a stream of hydrogen containing 2 mol percent HCl and flowing at a rate of 15 cc/minute, a stream of hydrogen containing 2 mol percent HCl and flowing at a rate of 35 cc/minute, a stream of hydrogen containing 0.2 mol percent $PH_3$ and 0.8 mol percent $AsH_3$ and flowing at a rate of 20 cc/minute, and a stream of hydrogen containing 0.1 mol percent $PH_3$ and 0.9 mol percent $AsH_3$ and flowing at a rate of 80 cc/minute are introduced into the reactor tube 4 through the respective gas inlets 9, 11, 10 and 12, while the other conditions remain the same as those in the first embodiment. In this case, a single crystal having the composition of $Ga_{0.81}\ In_{0.19}\ P_{0.11}\ As_{0.89}$ grows epitaxially. Measurement taken at 300°K on a specimen made of this mixed crystal showed that the mixed crystal had a carrier concentration of $4 \times 10^{18}\ cm^{-3}$ and a Hall mobility of 10,000 to 11,000 $cm^2/V$ sec.

Zinc is diffused into the mixed crystal in a manner similar to that employed in the first embodiment to make a pn diode, and a D.C. bias supply is connected to the pn diode as shown in FIG. 3. When forward current was supplied to the diode, it emitted light having a sharp peak at 8,900 A. at room temperature. The wavelength and profile of the peak show that the mixed crystal has a band structure of the direct transition type with a band gap of 1.36 eV. In other words, this mixed crystal has a band structure analogous to that of $Ga_{As}$.

A fifth embodiment of the present invention to be described now includes a bulk element made from a mixed crystal having the same composition as that described in the fourth embodiment, that is, the composition of $Ga_{0.81}\ In_{0.19}\ P_{0.11}\ As_{0.89}$.

In the course of the epitaxial growth of the mixed crystal in the fourth embodiment, the temperature gradient within the electric furnace may be varied by varying the value of the current supplied to the first stage of the electric furnace which may have a multistage structure so as to maintain the dopant source 8 in FIG. 1*a* at 350° C. for about 3 hours and then at 250° C. for about 1.5 hours. This results in the growth of a mixed crystal layer about 60 $\mu$ thick having a carrier concentration of $4 \times 10^{18}\ cm^{-3}$ and subsequent growth of a mixed crystal layer about 45 $\mu$ thick having a carrier concentration of $5 \times 10^{15}\ cm^{-3}$. The substrate portion is removed to leave solely a wafer including these grown layers, and an alloy consisting of 90 percent gold and 10 percent germanium added with nickel is evaporated on opposite surfaces of the wafer to provide a pair of electrodes in ohmic contact with the grown layers. A pellet of about 0.25 $mm^2$ is cut out from this wafer and is then subjected to mesa etching to eliminate any mechanical strain. By the above steps, a bulk element can be obtained in which the layer of low carrier concentration acts as the active region.

Figure 4:
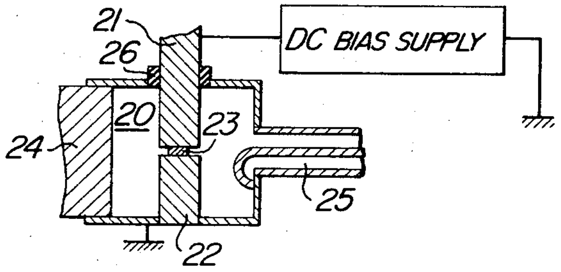
FIG. 4 is a schematic sectional view showing the electrical circuit of a solid state oscillation device according to the present invention.

Referring to FIG. 4, there is shown a schematic sectional view of one form of a solid state oscillator according to the present invention employing such a bulk element. In FIG. 4, a pair of opposite conductive rods 21 and 22 extend through opposite walls of a resonance cavity 20, and a bulk element 23 is interposed between the conductive rods 21 and 22. One of the remaining walls of the cavity 20 is formed by a short plunger 24 which acts to adjust the resonance frequency of the cavity 20. A coaxial cable 25 is coupled to another wall of the cavity 20 so as to thereby take out the microwaves generated in the cavity 20. The rod 21 is electrically insulated from the cavity wall by an insulator 26 and is connected to a D.C. bias supply, while the rod 22 is secured to the cavity wall. Thus, voltage supplied from the bias supply is applied across the bulk element 23 through the rods 21 and 22. The bulk element 23 inserted in the circuit is made from the mixed crystal having the composition of $Ga_{0.81}\ In_{0.19}\ P_{0.11}\ As_{0.89}$. A microwave of 3 GHz was generated when the low carrier concentration layer of the element 23 was connected to the negative pole of the D.C. bias supply.

The bulk oscillation thus produced corresponds to the Gunn oscillation in the case of GaAs. However, due to the fact that the mixed crystal of the above composition has a high thermal conductivity compared with that of GaAs (0.44W/cm. des.), the bulk oscillation element made from the mixed crystal can be operated at a higher input-output level than a Gunn diode made from GaAs and has a lesser tendency toward thermal deterioration.

A mixed crystal was grown under the same conditions as those described above except the dopant source 8 is eliminated. This mixed crystal was an n-type semiconductor which had a carrier concentration of $1 \times 10^{15}\ cm^{-3}$ and a Hall mobility greater than 12,000 $cm^2/V$ sec. It is apparent that this mixed crystal shows a further greater Hall mobility when the conditions for the crystal growth are more carefully selected so as to attain a better crystallinity. Therefore, this mixed crystal is suitable for use as a material for an element which carries out the function of pulse delaying, logical operation or the like at high speed taking advantage of the domain transit within the bulk or as a material for an element which carries out the function of amplification, modulation or the like for a signal of high frequency at a high power level taking advantage of the bulk negative resistance.

A sixth embodiment of the present invention to be described now includes a varactor diode made from a mixed crystal having the composition of $Ga_{0.81}\ In_{0.19}\ P_{0.11}\ As_{0.89}$.

In the course of the epitaxial growth of the mixed crystal in the fifth embodiment, the dopant source 8 may be maintained at 350° C. for about 3 hours and then at 285° C. for about 1.5 hours so as to cause the growth of a single crystal about 60 $\mu$ thick having the composition of $n^+ - Ga_{0.81}\ In_{0.19}\ P_{0.11}As_{0.89}$ with a carrier concentration of $4 \times 10^{18}\ cm^{-3}$ on the GaAs substrate and subsequent growth of a single crystal about 45 $\mu$ thick having the composition of $n - Ga_{0.81}\ In_{0.19}\ P_{0.11}\ As_{0.89}$ with a carrier concentration of $2 \times 10^{16}\ cm^{-3}$ on the previously grown single crystal. Zinc is diffused into this specimen in a manner similar to that described previously so as to form a p-type layer about 35 $\mu$ thick having a carrier concentration of 3 to 5 × $10^{18}$ $cm^{-3}$ on the surface of the n-type layer. The substrate portion is removed by grinding until the total thickness of the grown layers attains about 90 μ. Thus, the finished single crystal piece of $Ga_{0.81}In_{0.19}P_{0.11}As_{0.89}$ consists of the $n^+$ - type layer, n-type layer and p-type layer having respective thicknesses of 45 μ, 10 μ and 35 μ. Gold containing 5 percent tin is evaporated on the surface of the $n^+$-type layer and heat treatment is subsequently carried out. A pellet of 100 μ × 100 μ is cut out from this crystal piece. The pellet is bonded to a low-impedance microwave diode package. A dot of gold containing zinc is welded to the surface of the $P^+$-type layer and a lead is welded to the dot.

The diode thus obtained is then immersed in a 25 percent KOH solution and is subjected as the anode to electrolytic etching until the junction capacity of the pn junction attains 2 PF. The diode package is then hermetically sealed to complete a varactor diode. According to the results of a test made by the inventors on one hundred varactor diodes made by the above process, about 80 percent of them had a reverse breakdown voltage of 80 volts and a cut-off frequency of 240 GHz, while the remaining 20 percent of them had a reverse breakdown voltage distributed in the range of 55 to 95 volts and a cut-off frequency distributed in the range of 180 to 330 GHz. The junction capacities of these diodes in response to application of −6 volts averaged about 0.8 PF and lay in the range of 0.3 to 1.7 PF.

Figure 5:
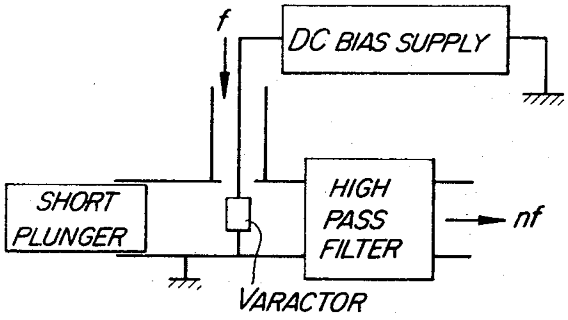
FIG. 5 is a block diagram showing the circuit of a frequency multiplier according to the present invention.

Referring to FIG. 5, there is shown a block diagram of one form of a frequency multiplier according to the present invention.

A microwave of frequency *f* admitted through a first wave guide acts upon a varactor diode to which a reverse voltage is applied from a D.C. bias supply. A higher harmonic of frequency *nf* (*n* is an integer) produced due to the non-linear characteristic of the junction capacity of the varactor diode is taken out by a second wave guide through a high-pass filter. A short plunger is provided to synchronize the circuit with a desired harmonic component.

According to the results of a test in which the varactor diode made from the mixed crystal of the above composition was employed and a 12 GHz, 500 mW microwave was introduced, a microwave of 24 GHz could be derived with a conversion loss of 5 dB. With a conventional GaAs varactor diode, the conversion loss at this frequency is generally of the order of 7 dB and it is thus apparent that the present invention exhibits excellent performance.

Figure 6:
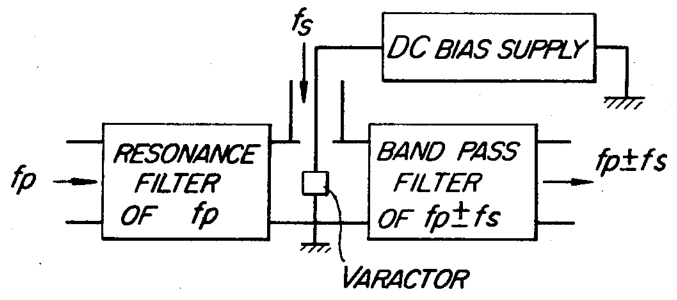
FIG. 6 is a block diagram showing the circuit of a parametric amplifier and up converter according to the present invention.

Referring to FIG. 6, there is shown a block diagram of a parametric amplifier and up converter according to the present invention. In FIG. 6, a signal microwave of frequency fs propagating through a first wave guide and a pump microwave of frequency fp propagating through a second wave guide and passed through a resonance filter act upon a varactor diode to which a reverse voltage is applied from a D.C. bias supply. Due to the non-linear characteristic of the junction capacity of the varactor diode, a microwave of frequency $fp \mp fs$ is generated and passes through a band-pass filter and propagates through a third wave guide to the led to the exterior. This device exhibited excellent performance when the varactor diode made from the mixed crystal of the above composition was incorporated therein than when a conventional GaAs varactor diode was used.

In a seventh embodiment of the present invention to be described now, a mixed crystal having the composition of $Ga_{0.76}In_{0.24}P_{0.76}As_{0.24}$ is made by the method of liquid phase epitaxy and this mixed crystal is used to make a pn junction light-emitting element.

About 10 grams of a mixture of indium and gallium mixed at a mol ratio of 4 : 1, about 190 milligrams of GaP not containing any dopant, about 600 milligrams of InAs and about 0.5 milligram of tellurium are placed at one end of a boat made of high-purity carbon. A single crystal piece of n-type GaAs is placed at the other end of the boat and is secured to the boat. The single crystal piece of gas has its (100) plane polished to a mirror finish and this plane is directed upwardly. The boat is fixed in a quartz tube and the quartz tube is horizontally inserted in an electric furnace. A stream of argon is supplied into the quartz tube at a flow rate of 500 cc/minute to replace the gas in the quartz tube by argon. Current is supplied to the electric furnace to raise the temperature of the boat up to 900° C. while continuously supplying streams of hydrogen and argon into the quartz tube at the same flow rate of 20 cc/minute. The electric furnace holding therein the quartz tube is slightly inclined so that the GaAs substrate is positioned above the materials in the boat. Due to the inclination, the melt of the materials is spaced apart from the substrate. After maintaining the temperature of the boat at 900° C. for about 1 hour, the electric furnace is inclined in the reverse direction to cause the melt to flow toward the substrate to cover same. The temperature of the boat is reduced to 700° C. at a cooling rate of 10° C./minute under the above state. When 700° C. is reached, the electric furnace is inclined again to separate the melt away from the substrate.

The above process is a method of liquid phase epitaxy which is so called the Nelson method. By the above process, a single crystal about 200 μ thick having the composition of $Ga_{0.76}In_{0.24}P_{0.76}As_{0.24}$ grows on the substrate. The substrate portion is removed by grinding and further the opposite surface portions of the grown layer are ground to leave solely the central portion thereof. Zinc is diffused into the grown layer thus obtained in a manner similar to that described previously. A pn junction diode is made from the crystal piece having been subjected to the diffusion treatment. The diode is connected to a D.C. bias supply as shown in FIG. 3. When forward current of 5 mA was supplied to the diode, it emitted red light due to the direct transition. The emission spectrum showed a sharp peak at 6,170 A. This peak had a half width of about 320 A.

Electrically luminescent devices have been especially described in detail in the embodiments illustrated hereinbefore. Among the pn junction diodes used in these electrically luminescent devices, the diode which emits light due to the direct transition can be utilized for detection of light with high efficiency as is commonly known. That is, when the diode of this type is irradiated with photons having the energy greater than the band gap, the number of conduction electrons is readily increased so that the intensity of light incident thereupon can be detected by a corresponding change in the current.

The above description has referred to an electronic device provided with an element which is made from a single crystal of the composition $Ga_x In_{1-x} P_y As_{1-y}$ ($0<x<1$, $0<y<1$) obtained by the methods of vapor phase epitaxy and liquid phase epitaxy. However, the process for the growth of the mixed crystal is not limited to such methods, and the materials of the mixed crystal may be deposited on the substrate at a suitable temperature by the technique of sputtering or vacuum evaporation. Further, in lieu of the fused liquid method employed in the seventh embodiment, the mixed crystal may be precipitated from a suitable solution of materials to cause the growth of the mixed crystal on the substrate.

Especially, in the case of causing the epitaxial growth of the mixed crystal by the method of vapor phase epitaxy, the composition thereof can be easily controlled in the following manner. In order to suitably control the composition of the mixed crystal, the total percentage of $PH_3$ and $AsH_3$ contained in the streams of hydrogen introduced into the reactor tube 4 through the gas inlets 10 and 12 may be kept at 1 mol percent and the ratio of $PH_3$ to $AsH_3$ may be suitably varied within this range so as to vary the value of $y$. The value of x can be suitably varied by varying the relative flow rate of the streams of hydrogen containing HCl which are introduced in the reactor tube 4 through the gas inlets 9 and 11.

By the above method, single-crystalline mixed crystals having various compositions could be epitaxially grown. The light-emitting characteristics of pn diodes and the oscillation characteristics of bulk elements made from some of these mixed crystals are shown in the following table:

Table

| composition of mixed crystal | Wavelength of principal peak | Half width of principal peak | Generation of oscillation |
|---|---|---|---|
| $Ga_{0.4} In_{0.6} P_{0.22} As_{0.78}$ | 10300 A | 200 A | Oscillation |
| $Ga_{0.34} In_{0.66} P_{0.86} As_{0.14}$ | 7860 A | 260 A | Oscillation |
| $Ga_{0.53} In_{0.47} P_{0.11} As_{0.89}$ | 11300 A | 200 A | Oscillation |
| $Ga_{0.62} In_{0.38} P_{0.66} As_{0.34}$ | 7200 A | 300 A | Oscillation |
| $Ga_{0.86} In_{0.14} P_{0.22} As_{0.78}$ | 8490 A | 200 A | Oscillation |
| $Ga_{0.91} In_{0.09} P_{0.63} As_{0.37}$ | 6030 A | 340 A | Oscillation |
| $Ga_{0.96} In_{0.04} P_{0.7} As_{0.3}$ | 5930 A | 1060 A | None |
| $Ga_{0.87} In_{0.13} P_{0.89} As_{0.11}$ | 6000 A | 1030 A | None |

As apparent from the above table, the light-emitting diode made from the mixed crystal capable of bulk oscillation shows a sharp emission peak and the mixed crystal has a band structure of the direct transition type, while the light-emitting diode made from the mixed crystal incapable of bulk oscillation shows an emission peak having a large half width and the mixed crystal has a band structure of the indirect transition type.

The mixed crystals are classified into a plurality of groups as described below according to their band structure and emission peak wavelength shown in the embodiments and the above table.

Figure 7:
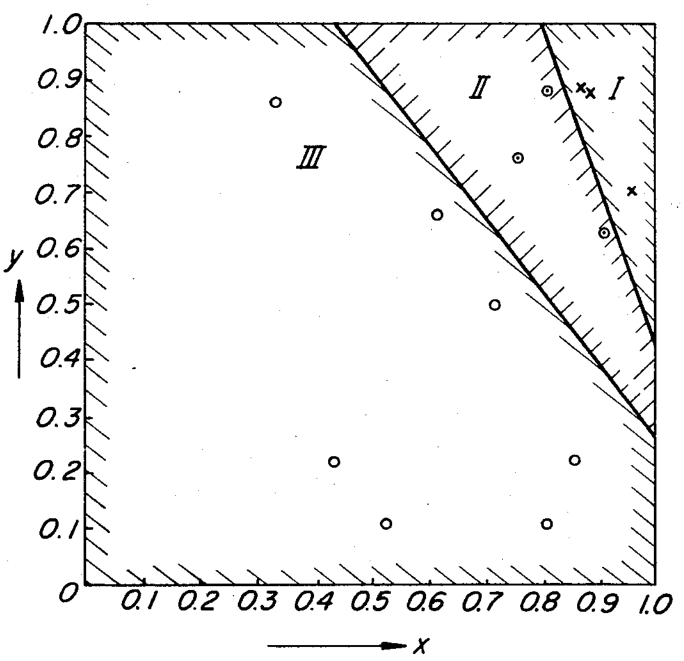
FIG. 7 is a graph showing a variety of peaks of emission produced by the mixed crystal used in the present invention depending on its composition.

Referring to FIG. 7, the values of $x$ and $y$ in the composition $Ga_x In_{1-x} P_y As_{1-y}$ are taken as the coordinates and the emission peaks are plotted on the graph. In FIG. 7, the symbols ○ and ⊙ show that the mixed crystals of the corresponding composition ranges have a sharp emission peak in the infrared range and visible range, respectively, while the symbol $x$ shows that the mixed crystal of the corresponding composition range has a wide emission peak in the visible range.

The region I including the symbol $x$ therein is defined by the straight lines $x=1$, $y=1$ and a straight line connecting between a point ($x=1$, $y=0.44$) at which the band structure of the ternary mixed crystal of the composition $Ga\ P_y As_{1-y}$ is changed from the direct transition type to the indirect transition type and a point ($x=0.8$, $y=1$) at which the band structure of the ternary mixed crystal of the composition $Ga_x In_{1-x} P$ is changed from the direct transition type to the indirect transition type. That is, the region I is defined by the straight lines $x=1$, $y=1$ and $y=-2.8x+2.24$. The mixed crystal belonging to this region has a large band gap and a band structure of the indirect transition type. Therefore, the mixed crystal belonging to the region I is suitable for a material for an element emitting visible light and also a material for a high-power, high-temperature circuit element.

The region II including the symbol ⊙ therein is defined by the straight lines $x=1$, $y=1$, the straight line connecting between the point ($x=1$, $y=0.44$) and the point ($x=0.8$, $y=1$), and a straight line connecting between a point ($x=1$, $y=0.26$) and a point ($x=0.44$, $y=1$) at which the emission peaks of the respective ternary mixed crystals $Ga\ P_y As_{1-y}$ and $Ga_x In_{1-x} P$ are shifted from the infrared range to the visible range. That is, the region II is defined by the straight lines $x=1$, $y=1$, $y=-2.8x+3.24$ and $y=-1.32x+1.58$. The mixed crystal belonging to this region has a relatively large band gap and a band structure of the direct transition type. Therefore, the mixed crystal belonging to the region II is suitable for a material for an element emitting visible light with high efficiency and also a material for a circuit element which carries out an active operation such as oscillation, amplification or modulation with high efficiency.

The region III including the symbol ○ is defined by the straight lines $x=0$, $y=0$, $x=1$, $y=1$ and $y=-1.32x+1.58$ connecting between the point ($x=1$, $y=0.26$) and the point ($x=0.44$, $y=1$). The mixed crystal belonging to this region has a relatively small band gap and a band structure of the direct transition type. Therefore, the mixed crystal belonging to the region III is suitable for a material for an element for radiating infrared light or laser beams with high efficiency or a material for an element which carries out an active operation such as oscillation, amplification or modulation with high efficiency.

The quaternary mixed crystals used in the present invention have been classified into a plurality of groups depending on their band gap and the type of transition, and their advantages and suitable applications have been described. However, the quaternary mixed crystal used in the present invention exhibits various merits in addition to a change in the band structure as described above. More precisely, the crystal lattices of the quaternary mixed crystal are occupied in a complex manner by the four kinds of elements, and thus the thermal, electrical and physical properties of the crystal differ conspicuously from those of binary or ternary crystals. By virtue of such a marked difference, the mixed crystal used in the present invention exhibits excellent performance which could not be expected heretofore in the applications of the kind described above.

The fifth and sixth embodiments have shown the fact that the bulk element and the varactor diode made from the quaternary mixed crystal exhibit performance which is far excellent compared with that of conventional elements made from GaAs.

In the ternary system of Ga – In – P, the mixed crystal having the composition of $Ga_{0.76}\ In_{0.24}\ P$ has a maximum band gap of 2.16 eV. However, the mixed crystal of this composition is unfit for a material for elements operating at high frequencies because it has a low Hall mobility of the order of 400 $cm^2/V$ sec.

In contrast to this ternary mixed crystal, the quaternary mixed crystal having the composition of $Ga_{0.85}\ In_{0.15}\ P_{0.8}\ As_{0.2}$ has a band gap of 2.16 eV which is the same as that of the above-described ternary mixed crystal, and yet has a high Hall mobility of 2,800 $cm^2/V$ sec. Further, this quaternary mixed crystal has a band structure of the direct transition type. Therefore a circuit element made from this mixed crystal has a cut-off frequency which is far higher than that of a circuit element made from the ternary mixed crystal. Further, a light-emitting diode made from this mixed crystal radiates visible light of short wavelengths with high efficiency. In addition, the mixed crystal has a thermal conductivity of 0.55 W/cm deg. which is higher than that of anyone of the group III–V compound semiconductors having a band gap of more than 2eV. Thus, the light-emitting diode can operate with a high input without any substantial thermal deterioration. The high mobility and high thermal conductivity described above are derived from the fact that the four kinds of elements distributed in the crystal lattices exert a favorable influence on the effective mass of carriers, the rate of scattering of carriers into the lattices and the rate of propagation of the lattice wave thereby improving the carrier mobility and thermal conductivity.

A trap level has developed frequently in the junction layer of a pn diode made from a conventional group III–V compound semiconductor, resulting in an undesirable reduction of the operating efficiency of the diode. This trap level is largely due to the lattice irregularity formed in the junction layer. However, in the case of a pn diode made from the quaternary mixed crystal used in the prescent invention, it has been observed that the combining action between the four elements prevents the formation of lattice defects thereby minimizing the undesirable reduction of the operating efficiency.

It will be appreciated from the foregoing description that the quaternary mixed crystal used in the present invention can be easily formed by the method of vapor phase or liquid phase epitaxy and the composition thereof can be easily controlled to any desired composition. Further, the mixed crystal has a band structure which is variable depending on the composition. Therefore, various optical and electrical devices can be manufactured by utilizing the mixed crystal of desired composition. Moreover, due to the interaction of the four elements, the mixed crystal shows thermal, electrical and chemical properties which are far excellent compared with those of conventional group III–V compound semiconductor crystals. By virtue of the above advantages, the device using an element made from the quaternary mixed crystal exhibits excellent performance compared with conventional devices of this kind.

What we claim is:

1. A solid state electronic device comprising an element body including a single crystal of quaternary compound semiconductor material consisting of In, Ga, P and As, said element body having a pair of electrodes in ohmic contact with the opposite surfaces thereof; and D.C. biasing means connected with said electrodes for causing said body to emit radiation.

2. A solid state electronic device according to claim 1, wherein said body includes a PN junction therein and said biasing means applies a forward voltage to said junction to cause the carriers therein to emit a radiation wave in the visible or infrared wavelength range.

3. A solid state electronic device according to claim 1, wherein said semiconductor material has a composition of $Ga_x\ In_{1-x}\ P_y\ As_{1-y}$ ($0 < x < 1$, $0 < y < 1$, $y < 3.24 - 2.8\ x$), said body includes a PN junction therein and said biasing means applies a junction voltage to said junction, whereby the carriers therein effect a photoelectric conversion via a direct electronic transition in said junction layer.

4. A solid state electronic device according to claim 3, wherein said biasing means applies a forward voltage to said junction, whereby said carriers emit a coherent radiation wave in the visible or infrared wavelength range.

5. A solid state electronic device according to claim 1, wherein said semiconductor material has a composition of $Ga_x\ In_{1-x}\ P_y\ As_{1-y}$ ($0 < x < 1$, $0 < y < 1$, $y < 3.24 - 2.8\ x$), and said biasing means applies such a high voltage to said body that said carriers effect the intervalley transition, form and transit a domain in said crystal.

6. A solid state electronic device according to claim 5, wherein said device further comprises a resonant cavity for the microwaves emitted from said carriers via said domain transit and a wave guide means coupled with said cavity for taking out said microwaves.

7. A solid state electronic device according to claim 1, wherein said body includes a PN junction therein and said biasing means applies a reverse bias voltage to said junction, whereby said carriers generate or convert microwaves via the non-linear characteristics of the capacity of said junction versus said applied voltage.

8. A solid state electronic device according to claim 7, wherein said device further comprises a first wave guide means for applying a signal microwave to said element body and a second wave guide means for taking out a higher harmonic component of said signal microwave, whereby the frequency conversion of microwaves is effected.

9. A solid state electronic device according to claim 7, wherein said device further comprises a first wave guide means for applying a signal microwave to said element body, a second wave guide means for applying a pumping microwave to said element body and a third wave guide means for taking out a modified microwave, whereby parametric amplification or up conversion of said signal microwave is effected.

10. A solid state electronic device for emitting a radiation wave comprising: an element including a single crystal of a quaternary compound semiconductor material consisting of Ga, In, P and As, said semiconductor material having a composition of $Ga_x In_{1-x} P_y As_{1-y}$ in the range of $0<x<1$, $0<y<1$, $Y<3.24-2.8x$ to show a band structure of direct transition type, said semiconductor material further possessing a thermal conductivity of at least 0.44W/cm.deg., a band gap of at least 1.36 eV and a Hall mobility of at least 2,800 $cm^2$/V. sec to be operated at a high power level, a high temperature and a high frequency, said element having a pair of electrodes in ohmic contact with the opposite surfaces thereof; and D.C. biasing means connected with said electrodes for causing the carriers in said crystal to emit a radiation wave, whereby said emission of radiation is effected with high efficiency at high power levels, high temperatures and high frequencies.

11. A solid state electronic device for emitting a radiation wave comprising: an element including a single crystal of a quaternary compound semiconductor material consisting of Ga, In, P and As, said semiconductor material having a composition of $Ga_x In_{1-x} P_y As_{1-y}$ in the range of $0<x<1$, $0<y<1$, $y<3.24-2.8x$ to show a band structure of direct transition type, said semiconductor material further possessing a thermal conductivity of at least 0.44 W/cm.deg., a band gap of at least 1.36 e V and a Hall mobility of at least 10,000 $cm^2$/V.sec to be operated at a high power level, a high temperature and a high frequency, said element having a pair of electrodes in ohmic contact with the opposite surfaces of said element; and D.C. biasing means connected with said electrodes for causing the carriers in said single crystal to emit a radiation wave, whereby said emission of radiation is effected with high efficiency at high power levels, high temperatures and high frequencies.

12. A solid state electronic device for emitting a radiation wave according to claim 11, wherein said element includes a pn junction therein to form a light-emitting diode and said biasing means applies such a forward voltage to said junction that said carriers emit infrared or visible light at said junction at a high power level.

13. A solid state electronic device for emitting a radiation wave according to claim 11, wherein said single crystal includes a region of low carrier concentration, said biasing means applies such a high voltage to said region that said region produces a Gunn oscillation at a high power level, and said device includes a resonant cavity for a microwave emitted by said carriers during said oscillation and waveguide means coupled with said cavity for taking out said microwave.

14. A solid state electronic device for emitting a radiation wave according to claim 11, wherein said element includes a pn junction therein to form a varactor diode and said biasing means applies such a reverse voltage to said junction that the carriers therein convert an incident microwave via the non-linear characteristics of the junction capacity of said varactor diode into another microwave, whereby said conversion of microwave and the emission of said converted microwave are effected with high efficiency at high frequencies.

15. A solid state electronic device for emitting a radiation wave according to claim 14, wherein said device further comprises first waveguide means for applying a signal microwave to said element and second waveguide means for taking out a higher harmonic component of said signal microwave, whereby the frequency multiplication of microwave is effected.

16. A solid state electronic device for emitting a radiation wave according to claim 14, wherein said device further comprises first waveguide means for applying a signal microwave to said element, second waveguide means for applying a pumping microwave to said element and third waveguide means for taking out a modified microwave, whereby the parametric amplification or up conversion of said signal microwave is effected.

17. A solid state electronic device for emitting a radiation wave according to claim 11, wherein said semiconductor material has a composition of $Ga_{0.81} In_{0.19} P_{0.11} As_{0.89}$.

18. A solid state electronic device for emitting a radiation wave comprising: an element made of a single crystal of a quaternary compound semiconductor material consisting of Ga, In, P and As, said single crystal including a pn junction therein to form a light-emitting diode, said semiconductor material having a composition of $Ga_x In_{1-x} P_y As_{1-y}$ in the range of $0<x<1$, $0<y<1$, $y<3.24-2.8x$ to show a band structure of direct transition type, said semiconductor material further possessing a thermal conductivity of at least 0.55 W/cm. deg., a band gap of at least 2 eV and a Hall mobility of at least 2,800 $cm^2$/V.sec to be operated at a high power level, a high temperature and a high frequency, said element having a pair of electrodes in ohmic contact with the opposite surfaces of said single crystal; and biasing means connected with said electrodes for applying such a forward bias to said junction that the carriers in said junction emit visible light of short wavelength, whereby said emission of light is effected with high efficiency at high power levels.

19. A solid electronic device for emitting a radiation wave according to claim 18, wherein said semiconductor material has a composition of $Ga_{0.85} In_{0.15} P_{0.8} As_{0.2}$.

20. A solid state electronic device comprising:

an element body including a crystal of quaternary compound of semiconductor material; and means for coupling a D.C. bias to said body.

21. A solid state electronic device according to claim 20, wherein said body further includes a region contacting said crystal and forming a PN junction therewith, and wherein said D.C. bias coupling means comprises a pair of electrodes being disposed on said body to apply a voltage across said PN junction.

22. A solid state electronic device according to claim 20, wherein said crystal is made of a pair of layers each consisting of said semiconductor crystal compound, but having different carrier concentrations.

23. A solid state electronic device according to claim 22, wherein said body further includes a region contacting said crystal and forming a PN junction therewith, and wherein said D.C. bias coupling means comprises a pair of electrodes being disposed on said body to apply a voltage across said PN junction.

24. A solid state electronic device according to claim 20, wherein said semiconductor material compound consists of In, Ga, x and As.

25. a solid state electronic device according to claim 24, wherein said material has a composition of $Ga_xIn_{1-x}P_yAs_{1-y}$, wherein $0<x<1$, $0<y<1$, and $y<3.24-2.8x$.

26. A solid state electronic device according to claim 25, wherein said material has the composition $Ga_{0.81}In_{0.19}P_{0.88}As_{0.12}$.

27. A solid state electronic device according to claim 25, wherein said material has the composition $Ga_{0.88}In_{0.12}P_{0.88}As_{0.12}$.

28. A solid state electronic device according to claim 25, wherein said material has the composition $Ga_{0.72}In_{0.28}P_{0.5}As_{0.5}$.

29. A solid state electronic device according to claim 25, wherein said material has the composition $Ga_{0.81}In_{0.19}P_{0.11}As_{0.89}$.

30. A solid state electronic device according to claim 25, wherein said material has the composition $Ga_{0.76}In_{0.24}P_{0.76}As_{0.24}$.

* * * * *